United States Patent
Post et al.

(10) Patent No.: US 9,239,785 B2
(45) Date of Patent: Jan. 19, 2016

(54) STOCHASTIC BLOCK ALLOCATION FOR IMPROVED WEAR LEVELING

(71) Applicant: Apple Inc., Cupertino, CA (US)

(72) Inventors: Daniel J. Post, Campbell, CA (US); Nir J. Wakrat, Los Altos, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/299,516

(22) Filed: Jun. 9, 2014

(65) Prior Publication Data

US 2014/0281179 A1 Sep. 18, 2014

Related U.S. Application Data

(63) Continuation of application No. 13/086,963, filed on Apr. 14, 2011, now Pat. No. 8,762,625.

(51) Int. Cl.
  *G06F 12/02* (2006.01)
  *G06F 3/06* (2006.01)
  *G11C 16/34* (2006.01)
  *G06F 7/58* (2006.01)

(52) U.S. Cl.
  CPC ........... *G06F 12/0246* (2013.01); *G06F 3/064* (2013.01); *G06F 3/0616* (2013.01); *G06F 3/0679* (2013.01); *G11C 16/349* (2013.01); *G06F 7/588* (2013.01); *G06F 2212/7211* (2013.01)

(58) Field of Classification Search
  CPC ... G06F 12/0246; G06F 3/0679; G06F 3/064; G06F 3/0616; G06F 7/588; G06F 2212/7211; G11C 16/349
  See application file for complete search history.

(56) References Cited

U.S. PATENT DOCUMENTS

| | | | |
|---|---|---|---|
| 5,535,369 A | 7/1996 | Wells et al. | |
| 6,307,852 B1 | 10/2001 | Fisher et al. | |
| 6,732,221 B2 | 5/2004 | Ban | |
| 6,850,443 B2 | 2/2005 | Lofgren et al. | |
| 7,120,729 B2 | 10/2006 | Gonzalez et al. | |
| 7,224,604 B2 | 5/2007 | Lasser | |
| 7,948,798 B1 | 5/2011 | Sheredy et al. | |
| 2006/0106972 A1* | 5/2006 | Gorobets | G06F 12/0246 711/103 |
| 2007/0208904 A1 | 9/2007 | Hsieh et al. | |
| 2009/0210195 A1 | 8/2009 | Thampy et al. | |
| 2010/0023675 A1* | 1/2010 | Chen et al. | 711/103 |
| 2010/0060934 A1 | 3/2010 | Bellert | |
| 2010/0174845 A1 | 7/2010 | Gorobets et al. | |
| 2010/0228928 A1* | 9/2010 | Asnaashari et al. | 711/154 |
| 2010/0318719 A1* | 12/2010 | Keays et al. | 711/103 |
| 2012/0030409 A1 | 2/2012 | Post et al. | |

* cited by examiner

*Primary Examiner* — Kevin Verbrugge
*Assistant Examiner* — Rocio Del Mar Perez-Velez
(74) *Attorney, Agent, or Firm* — Van Court & Aldridge LLP (57) ABSTRACT

Systems and methods are disclosed for stochastic block allocation for improved wear leveling for a system having non-volatile memory ("NVM"). The system can probabilistically allocate a block or super block for wear leveling based on statistics associated with the block or super block. In some embodiments, the system can select a set of blocks or super blocks based on a pre-determined threshold of a number of cycles (e.g., erase cycles and/or write cycles). The block or super block can then be selected from the set of super blocks. In other embodiments, the system can use a fully stochastic approach by selecting a block or super block based on a biased random variable. The biased random variable may be generated based in part on the number of cycles associated with each block or super block of the NVM.

19 Claims, 7 Drawing Sheets

STOCHASTIC BLOCK ALLOCATION FOR IMPROVED WEAR LEVELING

CROSS-REFERENCE TO RELATED APPLICATIONS

This application is a continuation of U.S. patent application Ser. No. 13/086,963 filed on Apr. 14, 2011 (now U.S. Pat. No. 8,762,625), which is hereby incorporated by reference herein in its entirety.

BACKGROUND OF THE DISCLOSURE

NAND flash memory, as well as other types of non-volatile memories ("NVMs"), are commonly used for mass storage. For example, consumer electronics such as portable media players often include flash memory to store music, videos, and other media.

A NVM can include multiple blocks and/or super blocks. In order to extend the lifespan of a NVM, it is preferable to have similar wear on all of the super blocks of a NVM. Therefore, in some cases, electronic devices may perform an operation known as "wear leveling" on one or more super blocks of the NVM.

In order to determine which super block to select for wear leveling, a system may rely on statistics associated with each super block of the NVM. These statistics may indicate the number of times a particular super block has been erased or programmed, and are generally aggregated for a period of time before being recorded on the NVM.

When a system experiences a power loss, however, unrecorded statistics may become lost. As a result, the system may be unable to accurately determine which block to select for wear leveling purposes.

SUMMARY OF THE DISCLOSURE

Systems and methods are disclosed for stochastic block allocation for improved wear leveling. As used herein, "stochastic" block allocation can refer to the non-deterministic selection of a block, where one or more blocks or super blocks have a random or probabilistic chance of being allocated.

In particular, a system having non-volatile memory ("NVM") can probabilistically allocate a block or super block based on statistics associated with the block or super block. In some embodiments, the system can select a set of blocks or super blocks based on a pre-determined threshold of a number of cycles (e.g., erase cycles and/or write cycles). A block or super block can then be selected from the set of super blocks. In other embodiments, the system can use a fully stochastic approach by selecting a block or super block based on a biased random variable. In some cases, the biased random variable may be generated based in part on the number of cycles associated with each block or super block of the NVM.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Systems and methods for stochastic block allocation for improved wear leveling are provided. As used herein, "stochastic" block allocation can refer to the non-deterministic selection of a block, where one or more blocks or super blocks have a random or probabilistic chance of being allocated.

A NVM interface of a system can probabilistically allocate a block or super block based on statistics associated with the block or super block. The block or super block may be allocated for any suitable programming purposes including, for example, host writing, garbage collection, and wear leveling. In some embodiments, in order to allocate a particular super block, a set of super blocks can be selected from multiple super blocks of a NVM based on a pre-determined threshold of a number of cycles (e.g., erase cycles and/or write cycles). For example, if the NVM interface determines that a lower-cycled super block needs to be allocated for dynamic host writes and garbage collection ("GC") writes, the NVM interface can select one or more super blocks that have a number of cycles that is lower than or equal to a pre-determined threshold (e.g., a $10^{th}$ percentile) of a total distribution of the number of cycles of the super blocks of the NVM. As another example, if the NVM interface determines that a higher-cycled super block needs to be allocated for wear leveling writes or static host writes, the NVM interface can select one or more super blocks that have a number of cycles that is greater than or equal to a pre-determined threshold (e.g., a $90^{th}$ percentile) of a total distribution of the number of cycles of the super blocks of the NVM.

In other embodiments, the system can use a fully stochastic approach by selecting a block or super block based on a biased random variable. The biased random variable may be generated based at least in part on the number of cycles associated with each block or super block of the NVM. In some cases, the probability of allocating a particular block or super block can increase if the number of cycles of the block or super block is closer to the number of cycles of a lowest-cycled or a highest-cycled block or super block.

Figure 1:
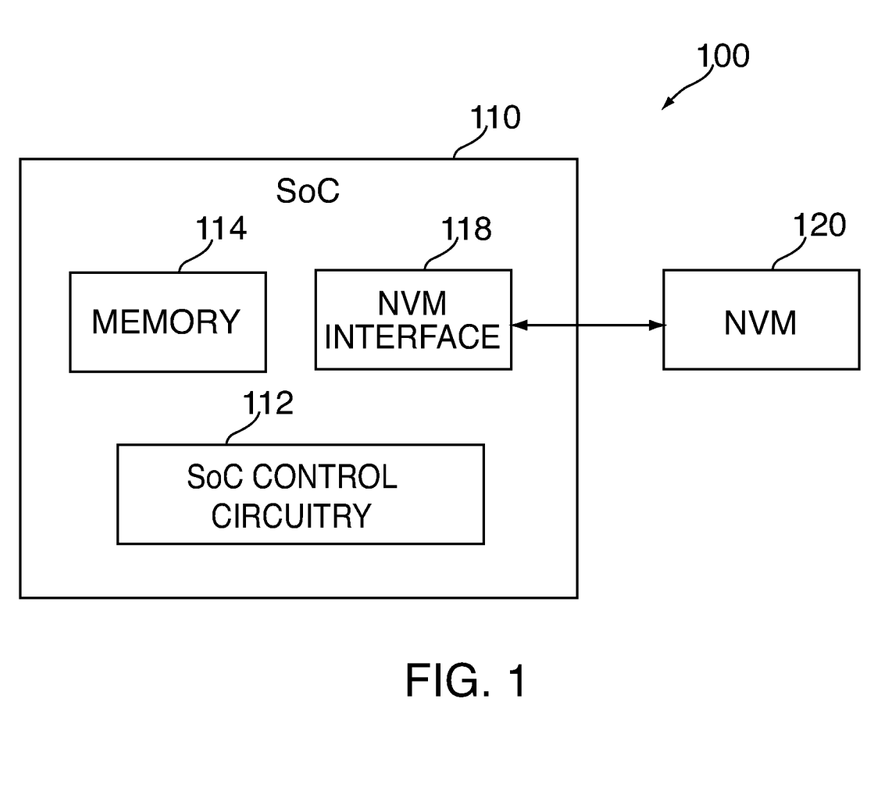
FIGS. 1 and 2 are block diagrams of electronic devices configured in accordance with various embodiments of the invention.

FIG. 1 illustrates a block diagram of electronic device 100. In some embodiments, electronic device 100 can be or can include a portable media player, a cellular telephone, a pocket-sized personal computer, a personal digital assistance ("PDA"), a desktop computer, a laptop computer, and any other suitable type of electronic device.

Electronic device 100 can include system-on-a-chip ("SoC") 110 and non-volatile memory ("NVM") 120. Non-volatile memory 120 can include a NAND flash memory based on floating gate or charge trapping technology, NOR flash memory, erasable programmable read only memory ("EPROM"), electrically erasable programmable read only memory ("EEPROM"), Ferroelectric RAM ("FRAM"), magnetoresistive RAM ("MRAM"), or any combination thereof.

NVM 120 can be organized into "blocks", which can be the smallest erasable unit, and further organized into "pages", which can be the smallest unit that can be programmed or read. In some embodiments, NVM 120 can include multiple integrated circuits, where each integrated circuit may have multiple blocks. Memory locations (e.g., blocks or pages of blocks) from corresponding integrated circuits may form "super blocks". Each memory location (e.g., page or block) of NVM 120 can be referenced using a physical address (e.g., a physical page address or physical block address).

System-on-a-chip 110 can include SoC control circuitry 112, memory 114, and NVM interface 118. SoC control circuitry 112 can control the general operations and functions of SoC 110 and the other components of SoC 110 or device 100. For example, responsive to user inputs and/or the instructions of an application or operating system, SoC control circuitry 112 can issue read or write commands to NVM interface 118 to obtain data from or store data in NVM 120. For clarity, data that SoC control circuitry 112 may request for storage or retrieval may be referred to as "user data," even though the data may not be directly associated with a user or user application. Rather, the user data can be any suitable sequence of digital information generated or obtained by SoC control circuitry 112 (e.g., via an application or operating system).

SoC control circuitry 112 can include any combination of hardware, software, and firmware, and any components, circuitry, or logic operative to drive the functionality of electronic device 100. For example, SoC control circuitry 112 can include one or more processors that operate under the control of software/firmware stored in NVM 120 or memory 114.

SoC control circuitry 112 can dispatch one or more commands to NVM 120. In some embodiments, SoC control circuitry 112 can include a block device driver or wrapper that can be configured to dispatch application programming interface ("API") operations to NVM 120 or a controller of NVM 120. In some embodiments, SoC control circuitry 112 can modify one or more parameters of the block device driver or wrapper in order to transfer information to NVM 120. For example, by modifying the one or more parameters, SoC control circuitry 112 can transfer information associated with commands used to access NVM 120 (e.g., read, program, erase, and/or write-multi commands).

Memory 114 can include any suitable type of volatile memory, such as random access memory ("RAM") (e.g., static RAM ("SRAM"), dynamic random access memory ("DRAM"), synchronous dynamic random access memory ("SDRAM"), double-data-rate ("DDR") RAM), cache memory, read-only memory ("ROM"), or any combination thereof. Memory 114 can include a data source that can temporarily store user data for programming into or reading from non-volatile memory 120. In some embodiments, memory 114 may act as the main memory for any processors implemented as part of SoC control circuitry 112.

NVM interface 118 may include any suitable combination of hardware, software, and/or firmware configured to act as an interface or driver between SoC control circuitry 112 and NVM 120. For any software modules included in NVM interface 118, corresponding program code may be stored in NVM 120 or memory 114.

NVM interface 118 can perform a variety of functions that allow SoC control circuitry 112 to access NVM 120 and to manage the memory locations (e.g., pages, blocks, super blocks, integrated circuits) of NVM 120 and the data stored therein (e.g., user data). For example, NVM interface 118 can interpret the read or write requests from SoC control circuitry 112, perform wear leveling, and generate read and program instructions compatible with the bus protocol of NVM 120.

While NVM interface 118 and SoC control circuitry 112 are shown as separate modules, this is intended only to simplify the description of the embodiments of the invention. It should be understood that these modules may share hardware components, software components, or both. For example, SoC control circuitry 112 may execute a software-based memory driver for NVM interface 118.

In some embodiments, electronic device 100 can include a target device, such as a flash memory drive or Secure Digital ("SD") card, that includes NVM 120 and some or all portions of NVM interface 118 (e.g., a translation layer, discussed below). In these embodiments, SoC 110 or SoC control circuitry 112 may act as the host controller for the target device. For example, as the host controller, SoC 110 can issue read and write requests to the target device.

Figure 2:
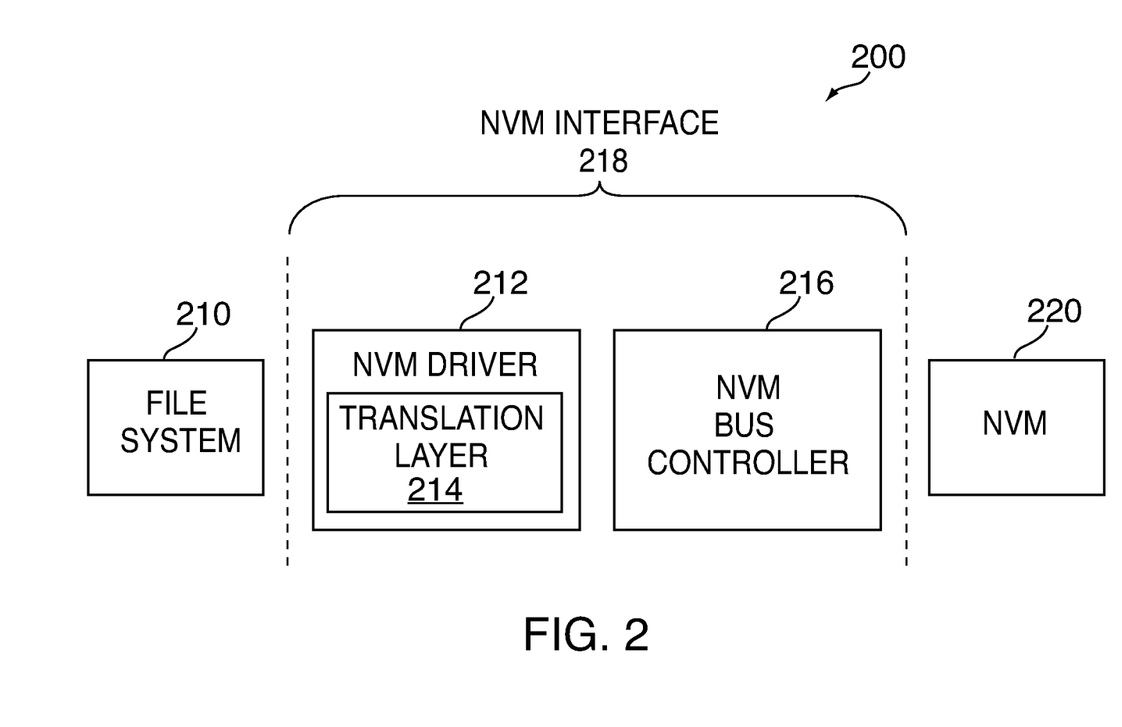

FIG. 2 illustrates a block diagram of electronic device 200, which may illustrate in greater detail some of the firmware, software, and/or hardware components of electronic device 100 (FIG. 1) in accordance with various embodiments. Electronic device 200 may have any of the features and functionalities described above in connection with FIG. 1, and vice versa. As shown, dashed lines demarcate the layers. It is understood that the depiction of which components fall within the demarcation lines are merely illustrative and that one or more components can be affiliated with a different layer.

Electronic device 200 can include file system 210, NVM driver 212, NVM bus controller 216, and NVM 220. In some embodiments, file system 210 and NVM driver 212 may be software or firmware modules, and NVM bus controller 216 and NVM 220 may be hardware modules. Accordingly, in these embodiments, NVM driver 212 may represent the software or firmware aspect of NVM interface 218, and NVM bus controller 216 may represent the hardware aspect of NVM interface 218.

File system 210 can include any suitable type of file system, such as a File Allocation Table ("FAT") file system or a Hierarchical File System Plus ("HFS+"), and may be part of the operating system of electronic device 200 (e.g., part of SoC control circuitry 112 of FIG. 1). In some embodiments, file system 210 may include a flash file system, which provides a logical to physical mapping of pages. In these embodiments, file system 210 may perform some or all of the functionalities of NVM driver 212 discussed below, and therefore file system 210 and NVM driver 212 may or may not be separate modules.

File system 210 may manage file and folder structures for the application and operating system. File system 210 may operate under the control of an application or operating system running on electronic device 200, and may provide write and read commands to NVM driver 212 when the application or operating system requests that information be read from or stored in NVM 220. Along with each read or write command, file system 210 can provide a logical address to indicate where the user data should be read from or written to, such as a logical page address or a logical block address ("LBA") with a page offset.

File system 210 may provide read and write requests to NVM driver 212 that are not directly compatible with NVM 220. For example, the logical addresses may use conventions or protocols typical of hard-drive-based systems. A hard-drive-based system, unlike flash memory, can overwrite a memory location without first performing a block erase.

Moreover, hard drives may not need wear leveling to increase the lifespan of the device. Therefore, NVM interface 218 can perform any functions that are memory-specific, vendor-specific, or both to handle file system requests and perform other management functions in a manner suitable for NVM 220.

NVM driver 212 can include translation layer 214. In some embodiments, translation layer 214 may be or include a flash translation layer ("FTL"). On a write command, translation layer 214 can map the provided logical address to a free, erased physical location on NVM 220. On a read command, translation layer 214 can use the provided logical address to determine the physical address at which the requested data is stored. Because each NVM may have a different layout depending on the size or vendor of the NVM, this mapping operation may be memory and/or vendor-specific.

NVM driver 212 may interface with NVM bus controller 216 to complete NVM access commands (e.g., program, read, and erase commands). Bus controller 216 may act as the hardware interface to NVM 220, and can communicate with NVM 220 using the bus protocol, data rate, and other specifications of NVM 220.

NVM interface 218 may manage NVM 220 based on memory management data, sometimes referred to herein as "metadata". The metadata may be generated by NVM driver 212 or may be generated by a module operating under the control of NVM driver 212. For example, metadata can include any information used for managing the mapping between logical and physical addresses, bad block management, wear leveling, error-correcting code ("ECC") data used for detecting or correcting data errors, or any combination thereof. The metadata may include data provided by file system 210 along with the user data, such as a logical address. Thus, in general, "metadata" may refer to any information about or relating to user data or used generally to manage the operation and memory locations of a non-volatile memory.

NVM interface 218 may be configured to store metadata in NVM 220. In some embodiments, NVM interface 218 may store metadata associated with user data at the same memory location (e.g., page) in which the user data is stored. For example, NVM interface 218 may store user data, the associated logical address, and ECC data for the user data at one or more memory locations of NVM 220. NVM interface 218 may also store other types of metadata about the user data in the same memory location.

NVM interface 218 may store the logical address so that, on power-up of NVM 220 or during operation of NVM 220, electronic device 200 can determine what data resides at that location. In particular, because file system 210 may reference the user data according to its logical address and not its physical address, NVM interface 218 may store the user data and logical address together to maintain their association. This way, even if a separate table maintaining the physical-to-logical mapping in NVM 220 becomes outdated, NVM interface 218 may still determine the proper mapping at power-up or reboot of electronic device 200, for example.

In addition to logical-to-physical address mapping, translation layer 214 can perform any of the other functions that may be typical of flash translation layers, such as garbage collection and wear leveling. For example, translation layer 214 can perform wear leveling to provide for similar wear on all blocks of NVM 220.

Conventionally, translation layer 214 can monitor statistics associated with each free super block of NVM 220. As used herein, "statistics" can refer to the number of cycles (e.g., erase cycles or write cycles) associated with each super block of NVM 220. In addition, as used herein, "free" super blocks may be one or more super blocks of NVM 220 that are available for programming.

For example, translation layer 214 can monitor the number of erase cycles and/or write cycles that each super block of NVM 220 has cycled through. Then, at a suitable time (e.g., during idle time or during a garbage collection process), translation layer 214 can select the lowest-cycled super block of NVM 220 to initiate wear leveling. As used herein, the lowest-cycled super block can be a super block that is associated with the smallest number of cycles, and consequently may have received less wear as compared to other super blocks of the NVM.

After selecting the lowest-cycled super block, translation layer 214 can initiate wear leveling on that super block. For example, translation layer 214 can free up and erase the lowest-cycled super block. In some embodiments, translation layer 214 can copy the valid data stored on the lowest-cycled super block to another super block that is fairly dynamic (e.g., the highest-cycled block of NVM 220). As used herein, the highest-cycled super block can be a super block that is associated with the highest number of cycles, and consequently has received more wear as compared to other super blocks of the NVM.

After the lowest-cycled super block has been erased, NVM interface 218 can program the lowest-cycled super block with new user data received from file system 210. Consequently, by performing wear leveling periodically on one or more super blocks of NVM 220, translation layer 214 can ensure that all super blocks of NVM 220 will ultimately have undergone a similar number of cycles and will therefore receive similar wear.

Because the wear leveling process depends on accurate statistics, it is preferable for statistics to be recorded each time a write or erase operation is performed on a super block. Generally, however, in order to decrease write amplification and improve system performance, statistics are aggregated for a period of time before being recorded to NVM 220. As a result, the granularity with which statistics are recorded and when the events actually occur (e.g., when super blocks are erased or programmed) can be different.

Moreover, statistics may be lost if a system failure (e.g., a power loss, error(s) in statistics recording, or a shut-down path error) occurs before statistics have been recorded to NVM 220. This may consequently cause wear leveling problems in a system. That is, due to the lost statistics, the same super block (e.g., the lowest-cycled and/or highest-cycled super block) may repeatedly be allocated for wear leveling purposes, which can lead to a block allocation bias (e.g., a physical skew in terms of super block cycling). Furthermore, in such a scenario, even if there are multiple super blocks that have the same lowest number or highest number of cycles, the system may still select the same super block due to the properties of a minimum or a maximum function. In particular, the system may automatically select either the first super block satisfying a minimum function (e.g., the lowest-cycled super block) or last super block satisfying a maximum function (e.g., the highest-cycled super block). Due to the block allocation bias, the system may be unaware that a particular super block is being cycled a disproportionate number of times.

Accordingly, a more robust system can be designed where super blocks are allocated stochastically rather than deterministically. As used herein, "stochastic" block allocation can refer to the non-deterministic selection of a block, where one or more blocks or super blocks have a random or probabilistic chance of being allocated.

In particular, instead of only allocating the lowest-cycled or the highest-cycled super block, the system can select from a set of super blocks, where each super block of the set of super blocks has a particular probability (e.g., a non-zero probability) of being selected. As a result, the NVM can become more wear leveled because the system can improve block allocation during both wear leveling and host writes. In particular, the system can avoid block allocation bias despite experiencing statistics loss.

Figure 3:
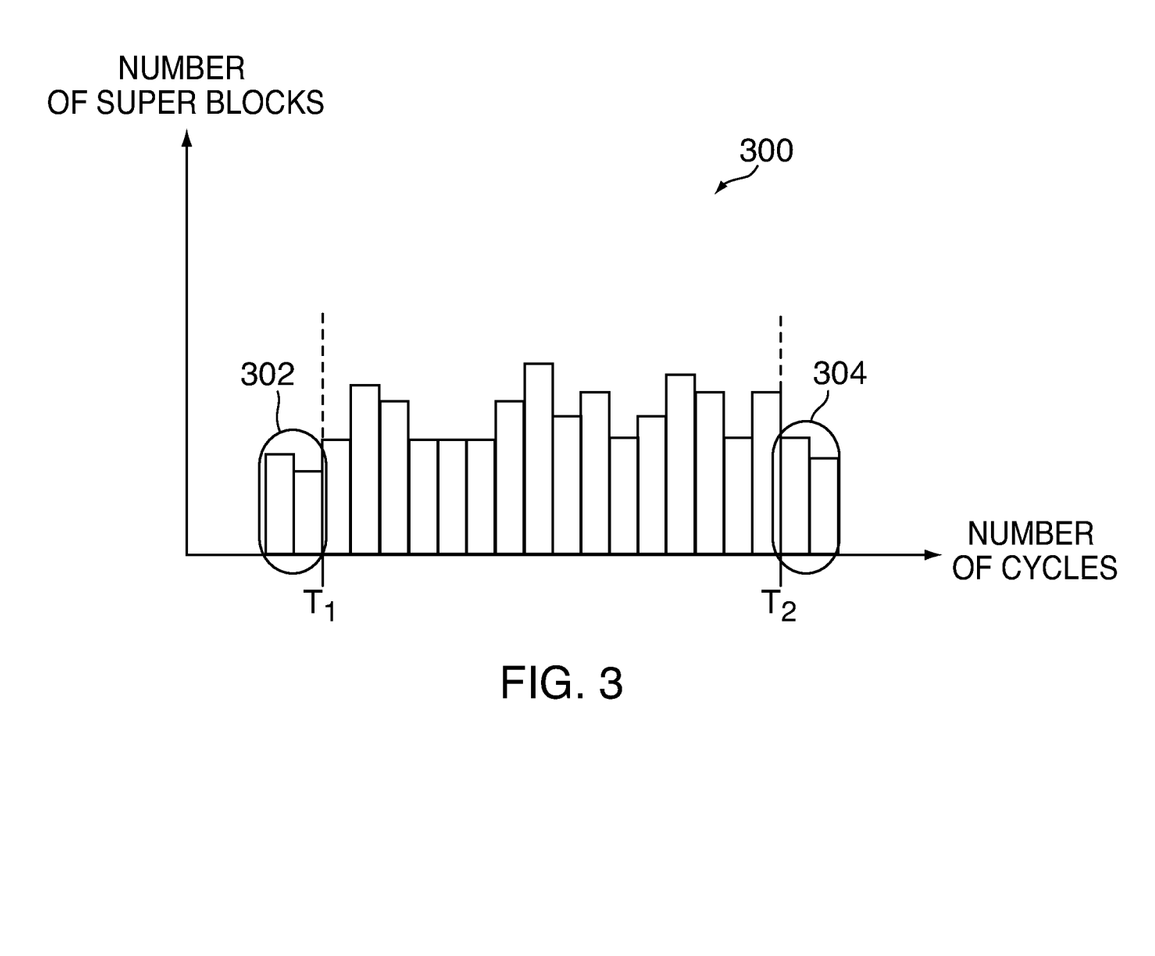
FIG. 3 is an illustrative total distribution of the number of cycles associated with various super blocks of a non-volatile memory in accordance with various embodiments of the invention.

In some embodiments, the set of super blocks can be selected based on a pre-determined threshold of a number of cycles (e.g., erase cycles and/or write cycles). For example, FIG. 3 shows an illustrative total distribution 300 of the number of cycles associated with various super blocks of a NVM (e.g., NVM 120 of FIG. 1 or NVM 220 of FIG. 2). In particular, total distribution 300 may correspond to the number of cycles associated with free super blocks of the NVM. Alternatively, total distribution 300 may correspond to the number of cycles associated with all super blocks of the NVM.

Although the following discussion refers to allocating super blocks, persons skilled in the art will appreciate that one or more blocks can also be allocated. Persons skilled in the art will appreciate that a NVM interface (e.g., NVM interface 118 of FIG. 1 or NVM interface 218 of FIG. 2) and/or a control circuitry (e.g., SoC control circuitry 112 of FIG. 1) of the system may perform one or more of the steps discussed below.

In particular, an NVM interface can select a set of super blocks from the free super blocks of a NVM. In some embodiments, if the NVM interface determines that a lower-cycled super block needs to be allocated, the NVM interface can select a set of super blocks that have a number of cycles that is lower than or equal to a pre-determined threshold of a total distribution of the number of cycles of multiple super blocks of the NVM (e.g., free super blocks or all super blocks of the NVM).

For example, as shown in FIG. 3, the pre-determined threshold (e.g., $T_1$ may be the $10^{th}$ percentile of total distribution 300 of the number of cycles of the super blocks of a NVM. That is, the NVM interface can select super blocks 302 that fall between the $0^{th}$ and $10^{th}$ percentile of total distribution 300 (e.g., each super block of super blocks 302 can have a number of cycles that is in a $10^{th}$ percentile of total distribution 300). Correspondingly, at least one super block of set of super blocks 302 can be a lowest-cycled super block (e.g., there may be multiple super blocks that have the same lowest number of cycles). Persons skilled in the art will appreciate that the pre-determined threshold may be set any suitable percentile of total distribution 300 (e.g., $20^{th}$ percentile, $30^{th}$ percentile, and so forth), where the pre-determined threshold can be selected based on one or more statistical parameters (e.g., mean and/or median of total distribution 300).

Similarly, if the NVM interface determines that a higher-cycled super block needs to be allocated, the NVM interface can select a set of super blocks that have a number of cycles that is greater than or equal to a pre-determined threshold of the total distribution of the number of cycles of multiple super blocks of the NVM.

For example, as shown in FIG. 3, the pre-determined threshold (e.g., $T_2$) may be the $90^{th}$ percentile of total distribution 300 of the number of cycles of the super blocks of the NVM. That is, the NVM interface can select super blocks 304 that fall between the $90^{th}$ and $100^{th}$ percentile of total distribution 300 for the set of super blocks (e.g., each super block of super blocks 302 can have a number of cycles that is in a $90^{th}$ percentile of total distribution 300). Correspondingly, at least one super block of the set of super blocks 304 can be a highest-cycled super block. Persons skilled in the art will appreciate that the pre-determined threshold may be set any suitable percentile of total distribution 300 (e.g., $80^{th}$ percentile, $70^{th}$ percentile, and so forth), where the pre-determined threshold can be selected based on one or more statistical parameters (e.g., mean and/or median of total distribution 300).

After selecting the set of super blocks, the NVM interface can allocate a super block of the set of super blocks, wherein the super block can be stochastically selected from the set of super blocks. For example, the NVM interface can allocate a random super block from the set of super blocks. As another example, the NVM interface can allocate a super block based on one or more statistical parameters. The one or more statistical parameters can include the mean of total distribution 300, the median of total distribution 300, any other suitable statistical parameter(s), and/or any combination thereof.

Figure 4:
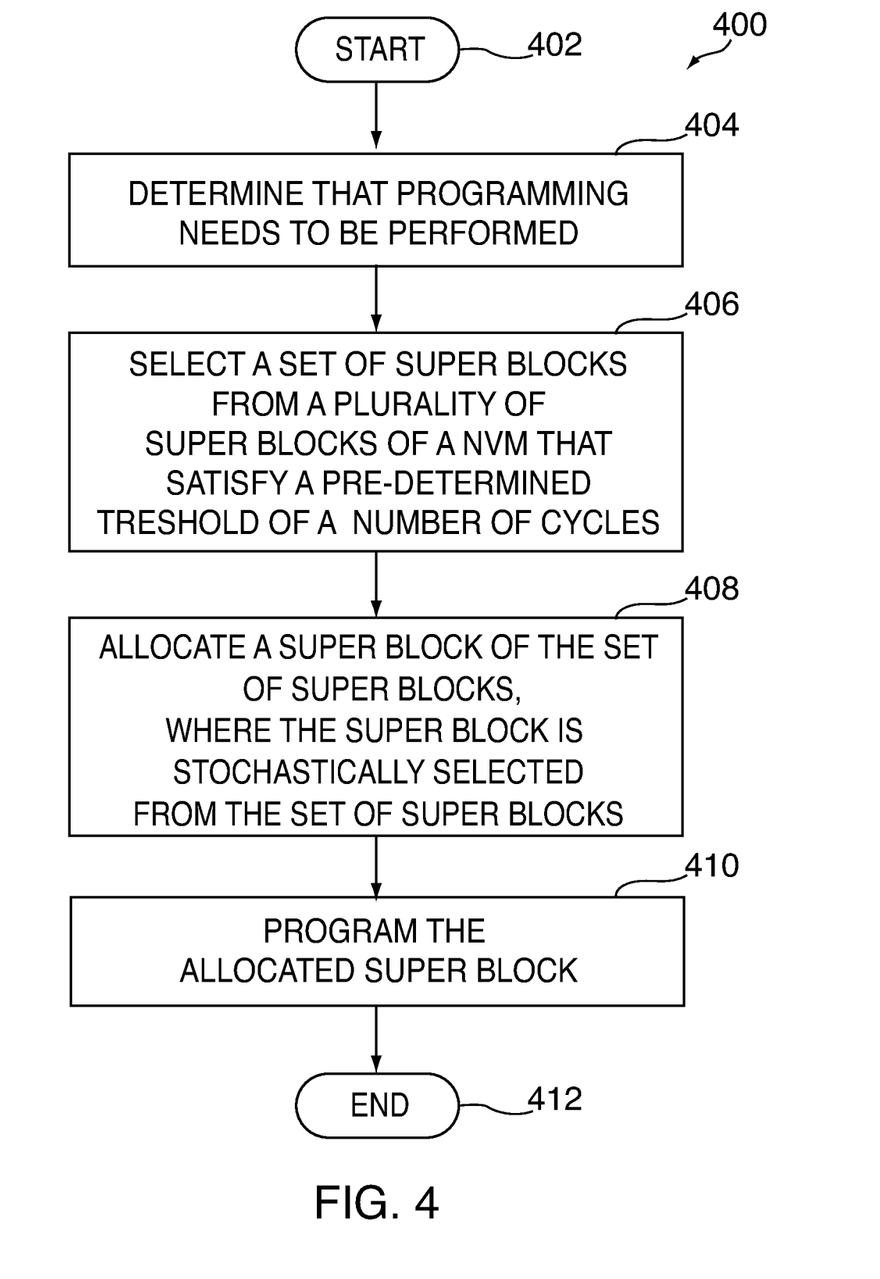
FIG. 4 is a flowchart of an illustrative process for allocating a super block in accordance with various embodiments of the invention.
Figure 5:
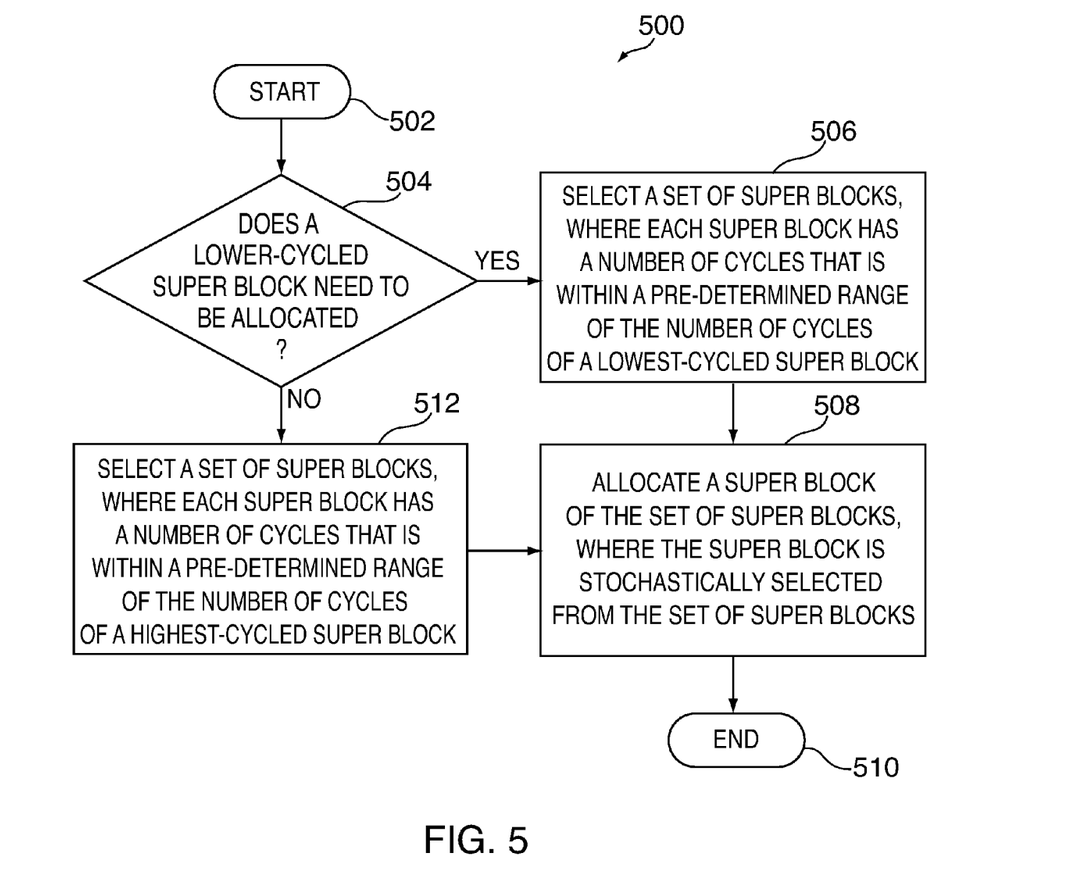
FIG. 5 is a flowchart of an illustrative process for allocating a lower-cycled super block or a higher-cycled super block in accordance with various embodiments of the invention.
Figure 6:
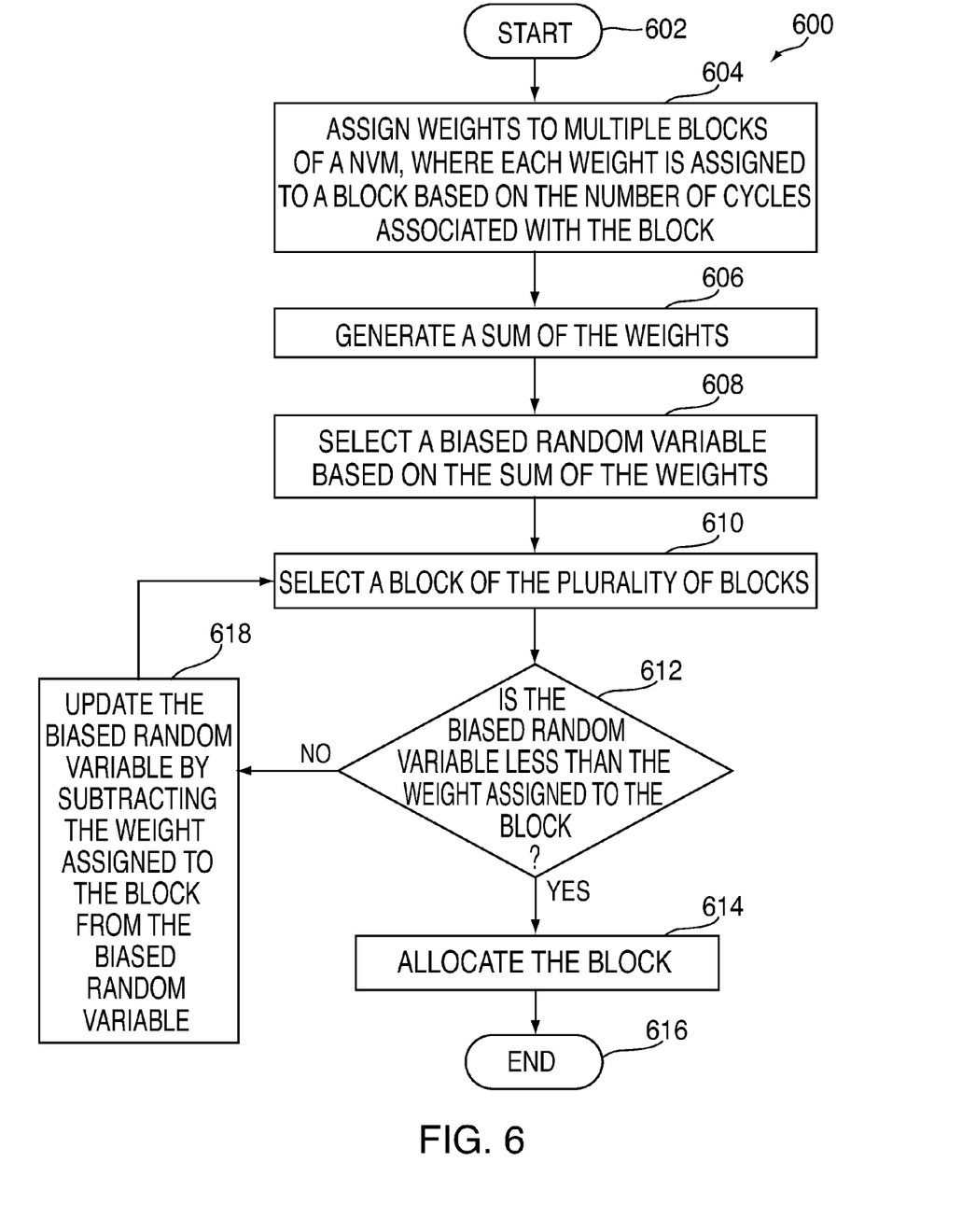
FIG. 6 is a flowchart of another illustrative process for allocating a super block in accordance with various embodiments of the invention.

Turning now to FIGS. 4-6, flowcharts of illustrative processes are shown in accordance with various embodiments of the invention. These processes may be executed by one or more components of a system (e.g., electronic device 100 of FIG. 1 or electronic device 200 of FIG. 2). For example, at least some of the steps in the processes of FIGS. 4-6 may be performed by a NVM interface (e.g., NVM interface 118 of FIG. 1 or NVM interface 218 of FIG. 2). In addition, persons skilled in the art will appreciate that at least some of the steps may be performed by control circuitry (e.g., SoC control circuitry 112 of FIG. 1).

Turning first to FIG. 4, process 400 is shown for allocating a super block. Process 400 may begin at step 402, and, at step 404, the NVM interface can determine that programming (e.g., wear leveling) needs to be performed on a NVM (e.g., NVM 120 of FIG. 1 or NVM 220 of FIG. 2).

At step 406, the NVM interface can select a set of super blocks from a plurality of super blocks of a NVM (e.g., free super blocks) that satisfy a pre-determined threshold of a number of cycles (e.g., erase cycles and/or write cycles). For example, the NVM interface can select set of super blocks 302 (FIG. 3) that are in the $10^{th}$ percentile of total distribution 300 (FIG. 3). As another example, the NVM interface can select set of super blocks 304 (FIG. 3) that are in the $90^{th}$ percentile of total distribution 300 (FIG. 3). In some cases, the pre-determined threshold can be selected based on one or more statistical parameters (e.g., mean and/or median) of a total distribution of the number of cycles of the plurality of super blocks.

Continuing to step 408, the NVM interface can allocate a super block of the set of super blocks, where the super block can be stochastically selected from the set of super blocks. For example, the NVM interface can select to allocate a random super block from the set of super blocks. As another example, the NVM interface can select to allocate a super block based on one or more statistical parameters. Therefore, in contrast to a conventional system, the super block that is allocated can be from the same statistical grouping as the lowest-cycled or highest-cycled super block, but is not necessarily the lowest-cycled or the highest-cycled super block.

At step 410, the NVM interface can direct a bus controller (e.g., NVM bus controller 216 of FIG. 2) to program the allocated super block (e.g., perform wear leveling using the allocated super block). Process 400 may then end at step 412.

Turning now to FIG. 5, process 500 is shown for allocating a lower-cycled super block or a higher-cycled super block. In some embodiments, process 500 can represent a more detailed view of the selecting a set of super blocks step 406 and the allocating the super block step 408 of process 400 (FIG. 4).

Process 500 may begin at step 502, and, at step 504, the NVM interface can determine whether a lower-cycled super block needs to be allocated (e.g., for dynamic host writes or GC writes). If, at step 504, the NVM interface determines that a lower-cycled super block needs to be allocated, process 500 may move to step 506. As used herein, "dynamic host writes" can refer to writes of data that are frequently updated or changed.

At step 506, the NVM interface can select a set of super blocks (e.g., free super blocks), where each super block has a number of cycles (e.g., erase cycles and/or write cycles) that is within a pre-determined range of the number of cycles (e.g., erase cycles and/or write cycles) of a lowest-cycled block. In particular, the pre-determined range can have a lower end that is equal to the number of cycles of the lowest-cycled block, and an upper end that is equal to a pre-determined percentile (e.g., $10^{th}$ percentile) of a total distribution (e.g., total distribution 300 of FIG. 3) of the number of cycles of multiple super blocks of a NVM (e.g., NVM 120 of FIG. 1 or NVM 220 of FIG. 2). After selecting the set of super blocks, process 500 may move to step 508.

At step 508, the NVM interface can allocate a super block of the set of super blocks, where the super block can be stochastically selected from the set of super blocks. The NVM interface can then direct a bus controller (e.g., NVM bus controller 216 of FIG. 2) to program the allocated super block (e.g., perform wear leveling on the NVM using the allocated super block). Process 500 may then end at step 510.

Referring back to step 504, if the NVM interface instead determines that a higher-cycled super block needs to be allocated (e.g., for wear leveling writes or static host writes), process 500 may move to step 512. As used herein, "static host writes" can refer to writes of data that are rarely updated or changed.

At step 512, the NVM interface can select a set of super blocks, where each super block has a number of cycles (e.g., erase cycles and/or write cycles) that is within a pre-determined range of the number of cycles (e.g., erase cycles and/or write cycles) of a highest-cycled block. For example, the pre-determined range can have a lower end that is equal to a pre-determined percentile (e.g., $90^{th}$ percentile) of a total distribution (e.g., total distribution 300 of FIG. 3) of the number of cycles of multiple super blocks of the NVM, and an upper end that is equal to the number of cycles of the highest-cycled block. After selecting the set of super blocks, process 500 may move to step 508, where the NVM interface can allocate a super block of the set of super blocks.

In some embodiments, a block or super block can be allocated based on a biased random variable using a fully stochastic approach. For example, the biased random variable may be generated based at least in part on the number of cycles (e.g., erase cycles and/or write cycles) associated with each block or super block of a NVM.

Referring now to FIG. 6, a flowchart of illustrative process 600 is shown for allocating a super block. Although the following discussion refers to allocating blocks, persons skilled in the art will appreciate that one or more super blocks can also be allocated.

Process 600 may begin at step 602, where the NVM interface can determine that a block needs to be allocated. Then, at step 604, the NVM interface can assign weights to multiple blocks (e.g., multiple free blocks) of a NVM (e.g., NVM 120 of FIG. 1 or NVM 220 of FIG. 2), where each weight can be assigned to a block based on the number of cycles associated with the block.

Figure 7:
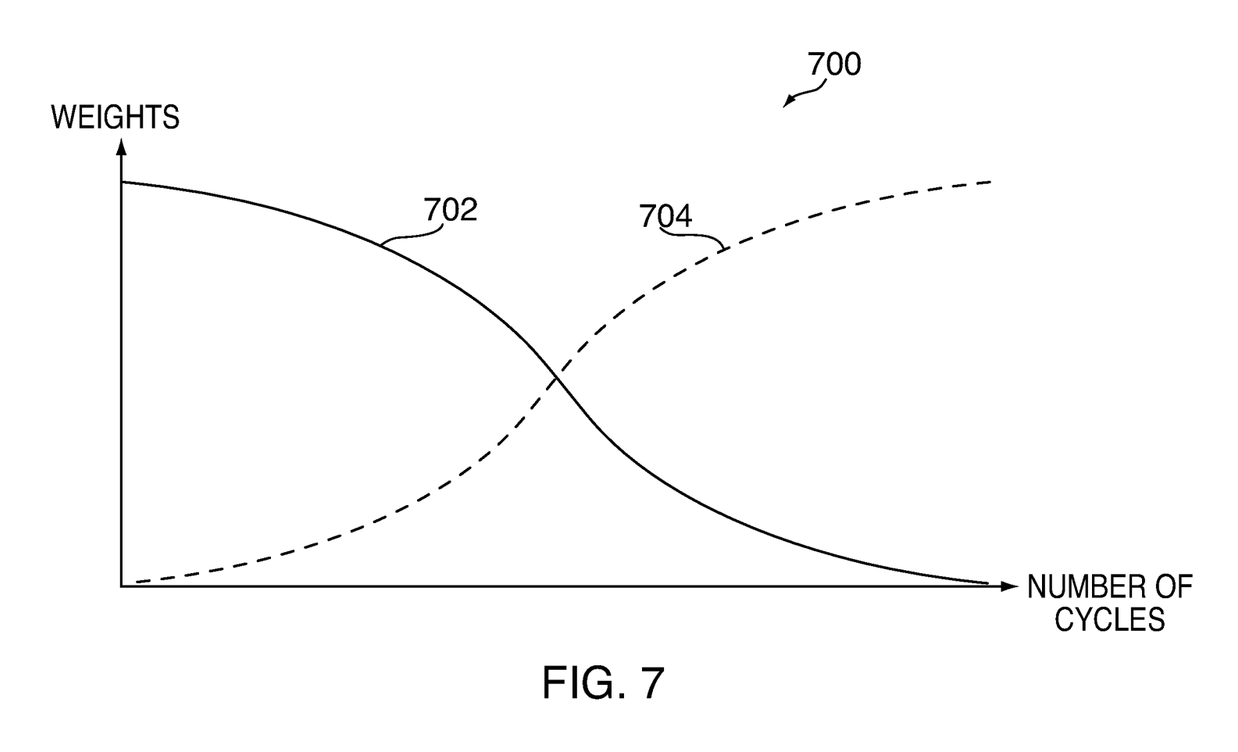
FIG. 7 is a graph of illustrative weights assigned to multiple super blocks of a non-volatile memory in accordance with various embodiments of the invention.

For example, FIG. 7 shows a graph 700 of illustrative weights 702 and 704 that may be assigned to multiple blocks of a NVM. Weights 702 can correspond to weights that are assigned if a lower-cycled block needs to be allocated, and weights 704 can correspond to weights that are assigned if a higher-cycled block needs to be allocated. As shown in FIG. 7, weights 702 can have lower values as the number of cycles corresponding to blocks increases, and consequently, lower cycled blocks have a higher probability of being selected. In contrast, weights 704 can have higher values as the number of cycles corresponding to blocks increases, and consequently, higher cycled blocks have a higher probability of being selected.

Referring back to FIG. 6, after assigning weights to each free block at step 604, process 600 may move to step 606. At step 606, the NVM interface can generate a sum of the weights.

Then, at step 608, the NVM interface can select a random variable based on the sum of the weights. The random variable can be selected using any suitable approach. For example, the NVM interface can subtract the sum of the weights by one to generate an upper range value. The random variable can then be selected to have a range between zero and the upper range value. In some cases, the NVM interface may introduce additional bias to the random variable by, for instance, squaring or cubing the random variable. The random variable can thus be biased towards either a lower-cycled block or a higher-cycled block.

Continuing to step 610, the NVM interface can select a block of the multiple blocks of the NVM. Then, at step 612, the NVM interface can compare the weight assigned to the block to the random variable. If, at step 612, the NVM interface determines that the random variable is less than the weight assigned to the block, process 600 may move to step 614.

At step 614, the NVM interface can allocate the block for programming. Moreover, the NVM interface can direct a bus controller (e.g., NVM bus controller 216 of FIG. 2) to perform programming on the block (e.g., perform wear leveling on the NVM using the allocated block). Process 600 may then end at step 616.

Referring back to step 612, if the NVM interface instead determines that the random variable is greater than or equal to the weight assigned to the block, process 600 may move to step 618. At step 618, the NVM interface can update the random variable by subtracting the weight assigned to the block from the random variable. Process 600 may then return to step 610, where the NVM interface can select another block of the NVM for comparison to the updated random variable. The NVM interface can thus iterate along the multiple blocks until it finds a block that satisfies the condition in step 612.

Accordingly, because of the biased random variable, the probability of allocating a particular block increases if the block has a lower or higher number of cycles. However, in contrast to a conventional approach, the probability of selecting a block that is not the lowest-cycled or highest-cycled block is non-zero. As a result, wear leveling does not depend on having completely accurate statistics, and block allocation bias can be avoided as variation is introduced into the blocks that are selected for allocation.

It should be understood that processes 400, 500, and 600 of FIGS. 4-6 are merely illustrative. Any of the steps may be removed, modified, or combined, and any additional steps may be added, without departing from the scope of the invention.

The described embodiments of the invention are presented for the purpose of illustration and not of limitation.

What is claimed is:

1. A method for super block allocation of a plurality of super blocks of a non-volatile memory ("NVM"), said NVM including multiple integrated circuits each having multiple blocks, for wear leveling, the method comprising:
   selecting, at a first time period, a set of super blocks, each super block comprising a plurality of blocks from corresponding integrated circuits, from the plurality of super blocks that satisfy a pre-determined threshold of a total distribution of the number of cycles of the plurality of super blocks;
   allocating, at a second time period, a super block of the set of super blocks for wear leveling, wherein the super block is stochastically selected from the set of super blocks, wherein the stochastic selection of the super block is a non-deterministic selection, and wherein the second time period occurs after the first time period; and
   performing wear leveling on the NVM using the allocated super block.

2. The method of claim 1, wherein the plurality of super blocks comprises the free super blocks of the NVM.

3. The method of claim 1, wherein the number of cycles is at least one of a number of erase cycles or a number of write cycles.

4. The method of claim 1, wherein the determining the set of super blocks further comprises:
   determining that a lower-cycled super block needs to be allocated for wear leveling; and
   selecting the set of super blocks, wherein each super block of the set of super blocks has a number of cycles that is one of lower than or equal to the predetermined threshold.

5. The method of claim 4, wherein at least one super block of the set of super blocks is a lowest-cycled super block.

6. The method of claim 4, wherein each super block of the set of super blocks has a number of cycles that is in a pre-determined percentile of the total distribution of the number of cycles of the plurality of super blocks, wherein the pre-determined percentile is selected based on at least one statistical parameter of the total distribution.

7. The method of claim 1, wherein the determining the set of super blocks further comprises:
   determining that a higher-cycled super block needs to be allocated for wear leveling; and
   selecting the set of super blocks, wherein each super block of the set of super blocks has a number of cycles that is one of greater than or equal to the pre-determined threshold.

8. The method of claim 7, wherein one super block of the set of super blocks is a highest-cycled super block.

9. The method of claim 7, wherein each super block of the set of super blocks has a number of cycles that is in a pre-determined percentile of the total distribution of the number of cycles of the plurality of super blocks, wherein the pre-determined percentile is selected based on at least one statistical parameter of the total distribution.

10. The method of claim 1, wherein the allocating further comprises allocating the super block of the set of super blocks based on at least one statistical parameter.

11. The method of claim 1, wherein the at least one statistical parameter is at least one of the mean of the total distribution of the number of cycles of the plurality of super blocks and the median of the total distribution of the number of cycles of the plurality of super blocks.

12. The method of claim 1, wherein the allocating the super block further comprises allocating a random super block from the set of super blocks.

13. A system comprising:
   a non-volatile memory ("NVM"), said NVM including multiple integrated circuits each having multiple blocks, comprising a plurality of super blocks, each super block comprising a plurality of blocks from corresponding integrated circuits;
   a bus controller operative to communicate with the NVM; and control circuitry operative to:
      determine whether a lower-cycled block needs to be allocated for wear leveling;
      in response to determining that a lower-cycled super block needs to be allocated for wear leveling, select, at a first time period, a set of super blocks, wherein each super block of the set of super blocks has a number of cycles that is within a pre-determined range of the number of cycles of a lowest-cycled block of the plurality of super blocks; and
      allocate, at a second time period, a super block of the set of super blocks for wear leveling, wherein the super block is stochastically selected from the set of super blocks wherein the stochastic selection of the super block is a non-deterministic selection, and wherein the second time period occurs after the first time period.

14. The system of claim 13, wherein the number of cycles is at least one of a number of erase cycles or a number of write cycles.

15. The system of claim 13, wherein the set of super blocks comprises free super blocks.

16. The system of claim 13, wherein the control circuitry is operative to direct the bus controller to perform wear leveling on the NVM using the allocated super block.

17. The system of claim 13, wherein the predetermined range has a lower end equal to the number of cycles of the lowest-cycled block, and an upper end equal to a pre-determined percentile of a total distribution of a number of cycles of the plurality of super blocks.

18. The system of claim 13, wherein in response to determining that a higher-cycled block needs to be allocated for wear leveling, the control circuitry is operative to:
   select a set of super blocks, wherein each super block of the set of super blocks has a number of cycles that is within a pre-determined range of the number of cycles of a highest-cycled block of the plurality of super blocks; and
   allocate a super block of the set of super blocks for wear leveling.

19. The system of claim 18, wherein the predetermined range has a lower end equal to a predetermined percentile of a total distribution of a number of cycles of the plurality of super blocks, and an upper end equal to the number of cycles of the highest-cycled super block.

* * * * *